United States Patent [19]
Kornblit et al.

[11] Patent Number: 6,021,215
[45] Date of Patent: Feb. 1, 2000

[54] DYNAMIC DATA VISUALIZATION

[75] Inventors: Avinoam Kornblit, Highland Park, N.J.; Nacer Layadi, Winter Park, Fla.; Tseng-Chung Lee, New York City, N.Y.; Edward Alois Rietman, Madison, N.J.

[73] Assignee: Lucent Technologies, Inc., Murray Hill, N.J.

[21] Appl. No.: 08/948,708

[22] Filed: Oct. 10, 1997

[51] Int. Cl.[7] .................................................. G06K 9/00
[52] U.S. Cl. ........................................ 382/141; 382/280
[58] Field of Search .................................... 382/280, 240, 382/255, 141; 378/54; 438/9; 216/60; 345/134, 340; 702/66

[56] References Cited

U.S. PATENT DOCUMENTS

| | | |
|---|---|---|
| 4,263,088 | 4/1981 | Gorin . |
| 4,616,318 | 10/1986 | Crawford .................................. 378/54 |
| 4,996,654 | 2/1991 | Rosenow . |
| 5,136,690 | 8/1992 | Becker et al. . |
| 5,160,402 | 11/1992 | Cheng . |
| 5,288,367 | 2/1994 | Angell et al. .............................. 216/60 |
| 5,444,837 | 8/1995 | Bomans et al. . |
| 5,452,410 | 9/1995 | Magidson . |
| 5,454,068 | 9/1995 | Ramanujam . |
| 5,581,797 | 12/1996 | Baker et al. . |
| 5,615,679 | 4/1997 | Ri et al. . |
| 5,632,009 | 5/1997 | Rao et al. . |
| 5,658,423 | 8/1997 | Angell et al. ............................... 438/9 |

OTHER PUBLICATIONS

Andrews, D. F., "Plots of High–Dimensional Data,," *Biometrics*, 28, 125–36, Mar., 1972, pp. 125–136.

Roman, G–C, and K.C. Cox, "A Taxonomy of Program Visualization Systems," *IEEE Computer Magazine*, vol. 26, No. 12, Dec., 1993, pp. 11–24.

*Primary Examiner*—Joseph Mancuso
*Assistant Examiner*—Vikkram Bali
*Attorney, Agent, or Firm*—William Ryan

[57] ABSTRACT

A data visualization method and apparatus permit the representation of multi-dimensional input data sequences as output sequences of closed form visual representations known as blobs. By noting changes in the shape of blobs as processing of the input sequence progresses, changes in characteristics of entities represented by the input sequence can be readily ascertained by observation. In an illustrative embodiment, a plasma etching process used in semiconductor fabrication can be observed and controlled by monitoring changes in blobs corresponding to the etching process variables.

16 Claims, 12 Drawing Sheets

DYNAMIC DATA VISUALIZATION

FIELD OF THE INVENTION

The present invention relates generally to the field of data visualization. More particularly, the present invention relates, in one aspect, to data visualization for observing and controlling physical processes, such as manufacturing processes. Still more particularly, aspects of the present invention relate to data visualization and control of semiconductor manufacturing processes.

BACKGROUND OF THE INVENTION

Data visualization (sometimes referred to as scientific visualization, or just visualization) is a term applied to a variety of techniques and processes for the representation of, or transformation of, data or information into images—including graphs, pictures, or other graphical forms. For convenience of reference, the term "visualization" will be used herein to mean any non-mental technique, method or process for representing or transforming data into images. "Data," means information in any form, but especially digital or numerical information.

Often, a motivation for applying visualization techniques is a need or desire to abstract, distill, concentrate or otherwise transform a large amount of data to manageable, but meaningful, proportions. Some common typical applications include graphical representation of medical imaging data (i.e., for applications such as magnetic resonance imaging, or MRI), or weather satellite data.

An overall view of the application of visualization is presented in *The Visual Display of Quantitative Information* (1983) and *Envisioning Information* (1990), both authored by Edward Tufte and published by the Graphics Press, Cheshire, Conn. U.S.A.

In a paper by D. F. Andrews entitled "Plots of High-Dimensional Data," *Biometrics*, 28, 125–36, March 1972, the author applies a visualization approach based on a Fourier transformation to the analysis of static multi-dimensional biological data.

Various approaches to the application of visualization to computer program organization and operation are discussed in the paper by Gruia-Catalin and Cox, entitled "A Taxonomy of Program Visualization Systems," appearing in *IEEE Computer Magazine*, vol. 26, no. 12, December, 1993. There, the authors propose an animation-based mapping from the realm of the programmer to that of the viewer of a graphical representation.

Visualization has also been applied in a number of business and industrial contexts involving a number of system variables to be viewed simultaneously. These applications tend to use tables, bar graph and other icons, as well as composite curve plots.

In semiconductor device manufacture, data provided by monitoring equipment associated with an etching chamber are often used to effect selective exposure of semiconductor materials to controlled amounts of plasma etching. Etching environments of this type are used, e.g., in etching silicon wafers with a number of film layers. Etching generally proceeds through one film until another film is reached. It is usually desired to end the etch just after the breakthrough from one film to the other. Thus timing of the endpoint for the etching process is of considerable importance in the manufacture of semiconductor devices.

Data generated by monitoring equipment associated with the etch are usually processed by monitoring circuitry, either alone or in combination with a computer, to control the rate and/or timing of exposure to plasma in the chamber. This monitoring circuitry typically includes sensors, filters and logic for adapting the monitoring data to the intended control function. Thus, by monitoring variables such as pressure, gas flow, impedance and optical spectra associated with the plasma etching process, preferred timing for process endpoint is derived.

In industrial processes like the above-mention plasma etching process, product quality and yield can be adversely affected by erroneous etch intensity and duration. In many cases, however, the interaction between monitored variables or the complexity of monitoring data makes the prediction of endpoint timing difficult, inexact and not readily reproducible.

SUMMARY OF THE INVENTION

Limitations of the prior art are overcome and a technical advance is made in accordance with the present invention described in illustrative embodiments herein.

In one illustrative embodiment, a visualization method transforms optical emission spectrum (OES) data signals derived from monitoring a semiconductor plasma etching process to produce visual images reflecting the state of the monitored process. In one aspect, this embodiment provides for Fourier transforming data signals corresponding to OES components present in the plasma etching environment, and generating polar coordinate representations of the transformed data signals. These polar coordinate representations, referred to as "Fourier blobs" or simply "blobs," when displayed on a graphical display device, prove to be valuable as an indicator of the state of the monitored process. In particular, observation of a sequence of Fourier blobs corresponding to the state of the plasma etching environment at discrete time intervals permits the detection of important points in the process, e.g., the approach to a desired process endpoint. Accordingly, the operator can accurately time the adjustment of process inputs to more accurately achieve the desired degree of etching. Each set of process environment conditions gives rise to a characteristic Fourier blob shape that changes in a predictable manner as the processing continues from early to later stages of etching. Thus, reproducibility of processing from batch to batch can be achieved by monitoring the characteristic blob shape changes through predictable stages to a predictable result.

More generally, processing of sequential sets of multi-dimensional data signals from many contexts can be accomplished using other embodiments of the present inventive methods and systems.

Advantageously, in accordance with one aspect of the present invention, the input data signals are collected as in the prior art systems from a real-time process such as the above-described semiconductor plasma etching process and are selected, transformed and displayed as the process unfolds.

In other particular contexts, input data signals will have been derived by monitoring or other collection procedures and stored in a list, table or database prior to transformation and display.

BRIEF DESCRIPTION OF THE DRAWING

The above-summarized description of illustrative embodiments of the present invention will be more fully understood upon a consideration of the following detailed description and the attached drawing, wherein.

DETAILED DESCRIPTION

Illustrative System Overview

Figure 1:
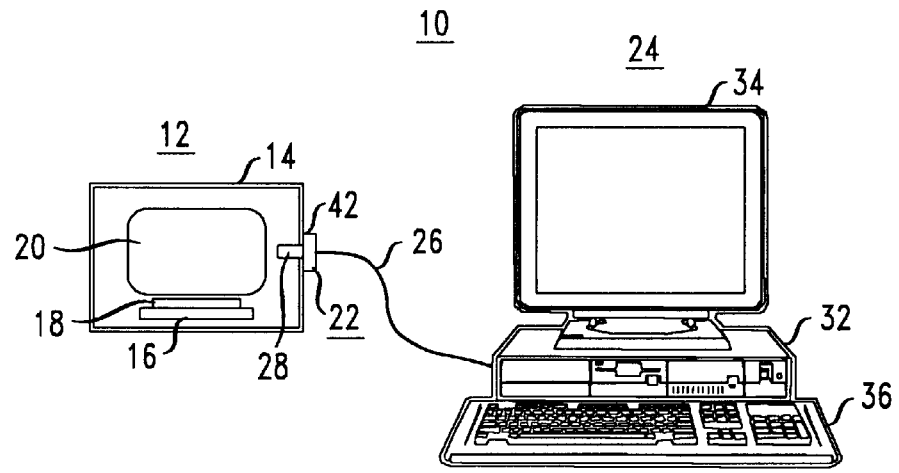
FIG. 1 is an overall view of an illustrative system embodiment of the present invention for monitoring and controlling a plasma etching process.

FIG. 1 shows an illustrative application of the present invention. There, a plasma etch system is monitored to supply OES data to be processed and displayed by a data processor.

More particularly, in FIG. 1 an endpoint detection system 10 in accordance with an illustrative embodiment of the present invention couples plasma etch system 12 to a data processing system 24 to effect this overall result. Plasma etch system 12 in turn includes a chamber 14 and a cathode 16. A semiconductor wafer 18 is typically supported by the cathode 16, and a plasma discharge 20 is formed over the cathode 16 by applying radio frequency (RF) power to at least the cathode 16. By plasma etch system is meant herein a system which produces a plasma discharge, including conventional plasma etch systems where both a cathode and an anode are RF powered and reactive ion etch (RIE) systems where only the cathode is provided with RF power. An illustrative plasma reaction chamber 14 is a model 5300 Omega system from Applied Materials.

The illustrative endpoint detection system 10 in FIG. 1 also includes a sensor assembly 22 coupled to computer system 24 by a cable 26. The sensor assembly 22 has a probe portion 28 which extends into chamber 14 through an aperture in the chamber wall and a housing portion 42 which encloses photosensors and analog circuitry for the sensor assembly. The digital computer system 24 typically comprises a general purpose digital computer such as a personal computer, workstation or minicomputer made by such well known manufacturers as IBM, Apple, Sun and Hewlett-Packard. The digital computer system 24 typically includes a base unit 32 enclosing the CPU, memory, disk drives and I/O ports, a monitor 34 for visually displaying output from the system and a keyboard 36 for entering commands and data into the system.

Details of illustrative photosensors and their connection to computer system 24 are well known in the art. One example of such system elements and their interconnection is provided in U.S. Pat. No. 5,160,402 issued to Cheng on Nov. 3, 1992, which patent is hereby incorporated by reference in the present description as if set out in its entirety herein. It will be recognized by those skilled in the art that other particular sensors may be employed, and that the techniques described by Cheng for weighting and combining data from the sensors forms no necessary part of the present invention. Rather, as will be detailed below, the data from individual optical sensors is received by computer system 24 and transformed into a sequence of Fourier blobs for observation by a system operator.

U.S. Pat. No. 4,263,088 issued Apr. 21, 1981 to Gorin further illustrates a plasma etching chamber and monitoring of a plasma etch process for control of the plasma reaction. Specifically, Gorin teaches adjustment of power to the plasma reaction from continuous input to pulsed input when certain emission characteristics are detected. The above-cited Gorin patent is hereby incorporated by reference as if set forth in its entirety herein.

In an illustrative system of the type shown in FIG. 1, it proves convenient to use a number, m, of sensors each providing OES data at a respective frequency. Frequency selection is typically achieved using optical filters between the optical energy source of the plasma environment and the photosensors. It will be understood that the sensor outputs are processed by standard amplifiers, filters and related analog circuitry (not shown in FIG. 1) as may be required to produce output signals indicative of the amplitude of optical intensity in the plasma environment at a respective frequency or spectral line. These individual output signals are then sampled in standard fashion at discrete time intervals to produce digital representations of the sensor data to data processor 24 over link 26.

Figure 2:
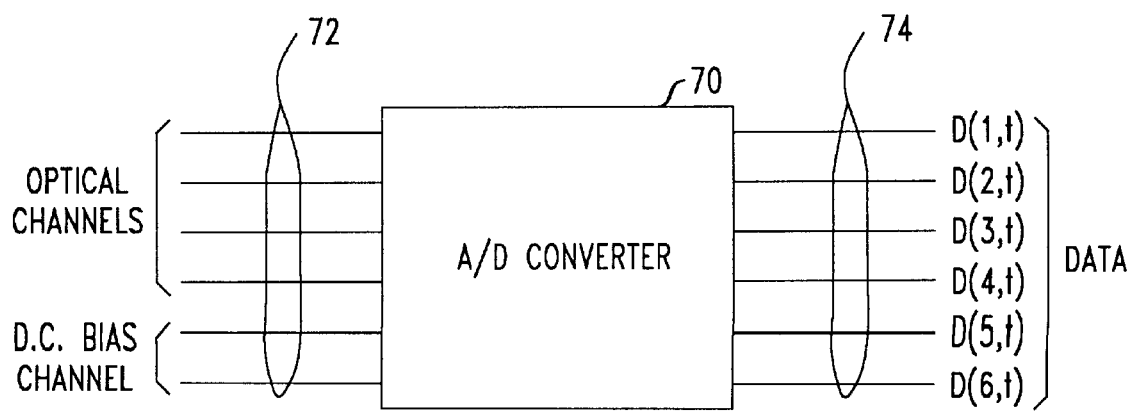
FIG. 2 shows additional circuitry advantageously used to convert sensor signals in the system of FIG. 1 to a form suitable for processing by a computer in that system.

FIG. 2 illustrates apparatus embodying these latter functions in showing outputs 72 from the sensors passing through analog-to-digital converter 70 to produce digital outputs 74 labeled D(i,t), i=1,2, . . .m, where t assumes increasing values of discrete time, i.e., t=1,2,3, . . .n. In one illustrative case, optical emissions may be monitored at five discrete frequencies, i.e., m=5. Illustratively, the five data outputs provide OES data at wavelengths of 251, 288, 309, 727 and 777 nm, though other particular values may prove convenient in other applications. It also proves convenient in some circumstances to include an indication of the value of d.c. bias for the etch system cathode. This can result in an additional data output sequence, shown as D(6,t) in FIG. 2, but this bias data need not be used in the Fourier blob processing for the five-frequency etch-monitoring system of the current example. Use of bias data and other system parameters proves useful in forming blobs, and will be described below, according, process parameters including gas flows, pressures and mixes, electrical potentials and power may prove useful and are supplied, as needed, via cable 26 and converter 70 to data processor 24.

Fourier Blob Processing

As noted above and in the incorporated patents, careful tiring of an etch process is very important to the quality of the resulting device. When etching through one film until another film is encountered, it is generally desired to end the etch shortly after breakthrough from etching the first film.

By monitoring several optical wavelengths in the optical emission in the manner described above, direct pointers to the molecular species in the plasma are obtained.

Figure 3:
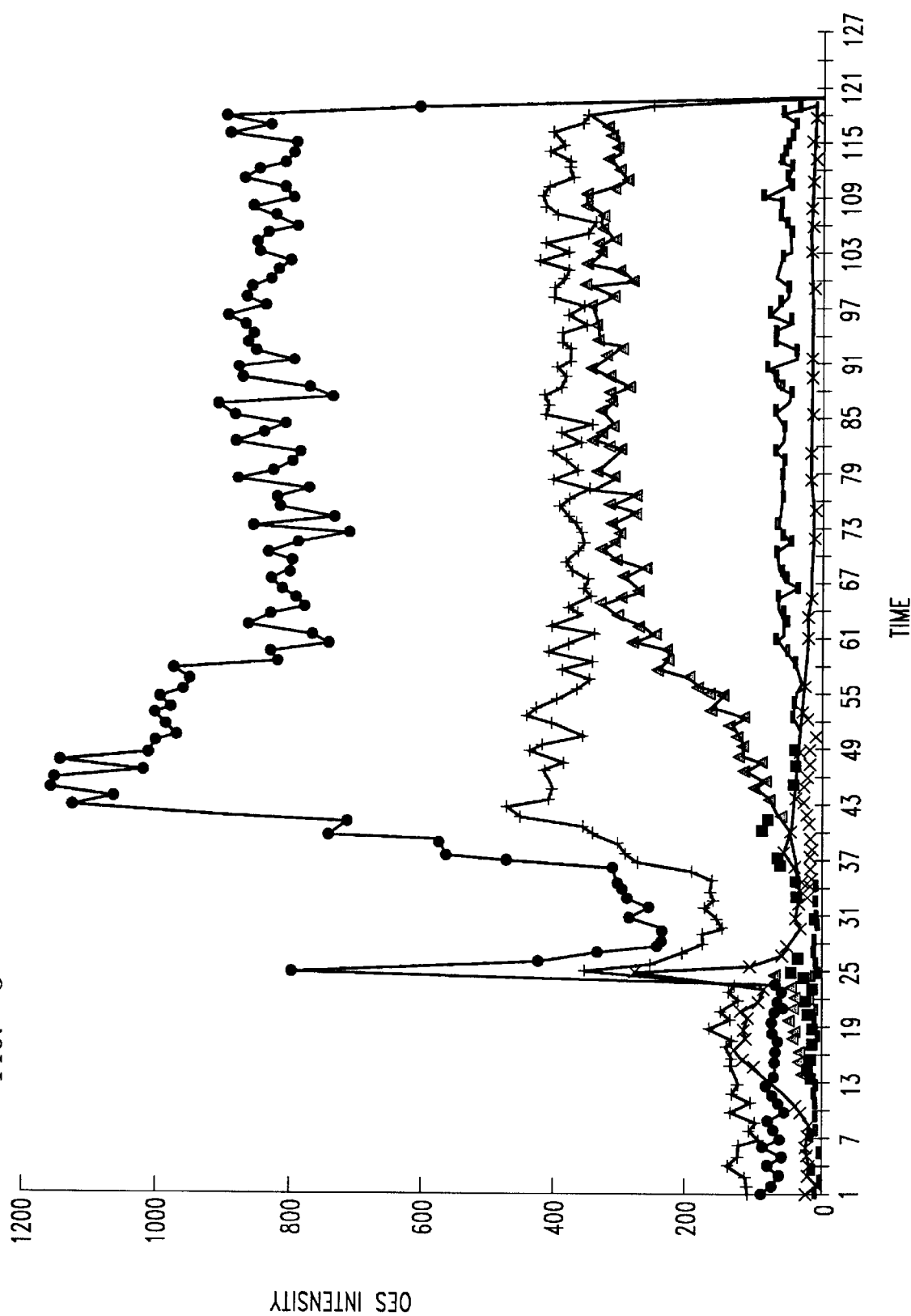
FIG. 3 shows plots for OES data signals for m-8 spectrum lines during an illustrative plasma etching operation.

FIG. 3 is a plot of optical emission spectral (OES) lines during an illustrative etching of a refractory material on top of a polysilicon layer, and etching the polysilicon layer to an endpoint on an oxide layer. In this illustration the number of spectral lines monitored is eight, i e., m=8. It will be noted that precise identification of the endpoint of the etch is not readily apparent from the OES plot of FIG. 3. Most process points, e.g., breakthrough from the refractory layer to the polysilicon layer and the endpoint for the etch from the polysilicon layer to the oxide layer are identifiable only approximately from the plot of FIG. 3.

Because of the abundance of raw data and the complexity of the underlying monitored process, it proves convenient, in accordance with an aspect of the present invention, to employ data visualization using transformation of the input data to Fourier blobs.

If intensity data for each of the m monitored OES lines is designated $I_i$, i=1, . . . ,m, the monitored OES data take the form of a set of data points $[I_1, \ldots, I_m]$ for each sample time, t. Using a Fourier representation for a data set generally in the manner of the Andrews paper cited above, yields, for m=8

$$f(\theta,t)=I_1/\sqrt{2}+I_2 \sin \theta+I_3\cos\theta+I_4 \sin 2\theta+I_5 \cos 2\theta+I_6\sin 3\theta+I_7 \cos 3\theta+I_8\sin 4\theta \quad \text{(Eq. 1)}$$

Figure 4:
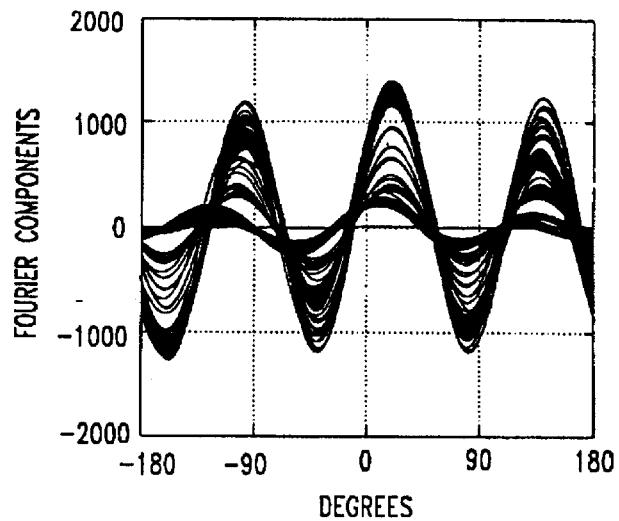
FIG. 4 shows a plot of a time sequence of Fourier transformed OES spectrum data signals.

When plotted on Cartesian coordinates this function (for a time sequence t=1, . . . ,n) has the form shown in FIG. 4. It will be noted that the plot in FIG. 4 not only removes much of the original information some plasma system engineers would recognize as identifying (at least approximately) the process endpoint, but also obscures important details that would help system operators to recognize as a process endpoint.

Figure 5:
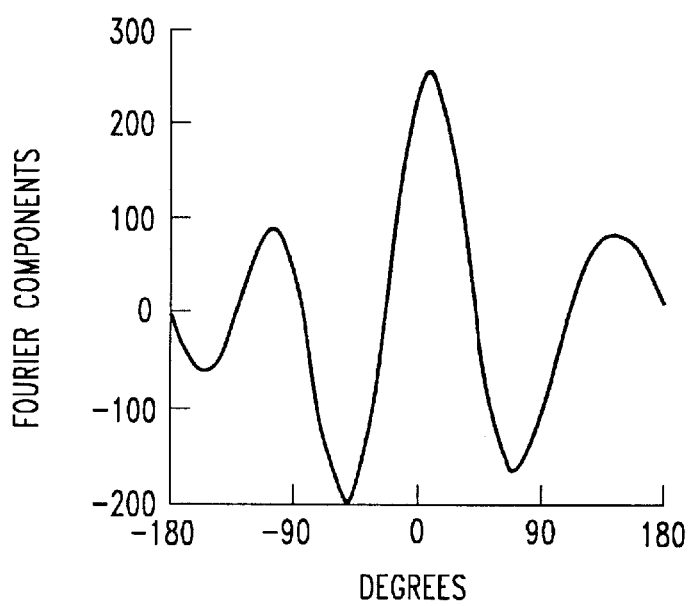
FIG. 5 shows a plot of Fourier transformed OES spectrum data signals at a single sampling time.

A plot of the function f of (Eq. 1) for one time instant appears in FIG. 5. It also proves quite difficult to view a sequence of plots of the form shown in FIG. 5 to discern meaningful changes in the monitored plasma etching process.

Figure 6:
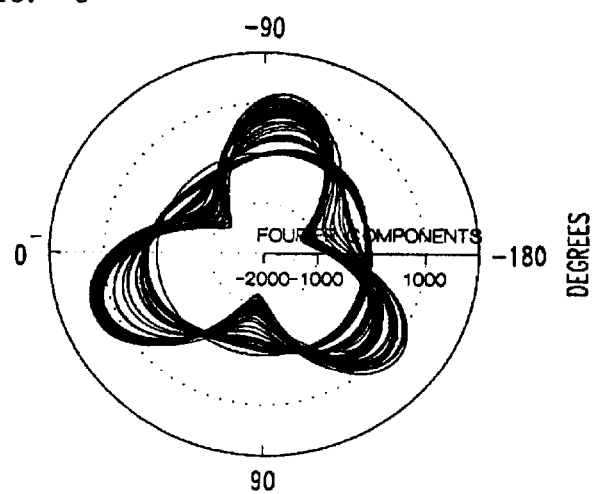
FIG. 6 shows a polar coordinate plot of a time sequence of Fourier transformed OES spectrum data signals.
Figure 7:
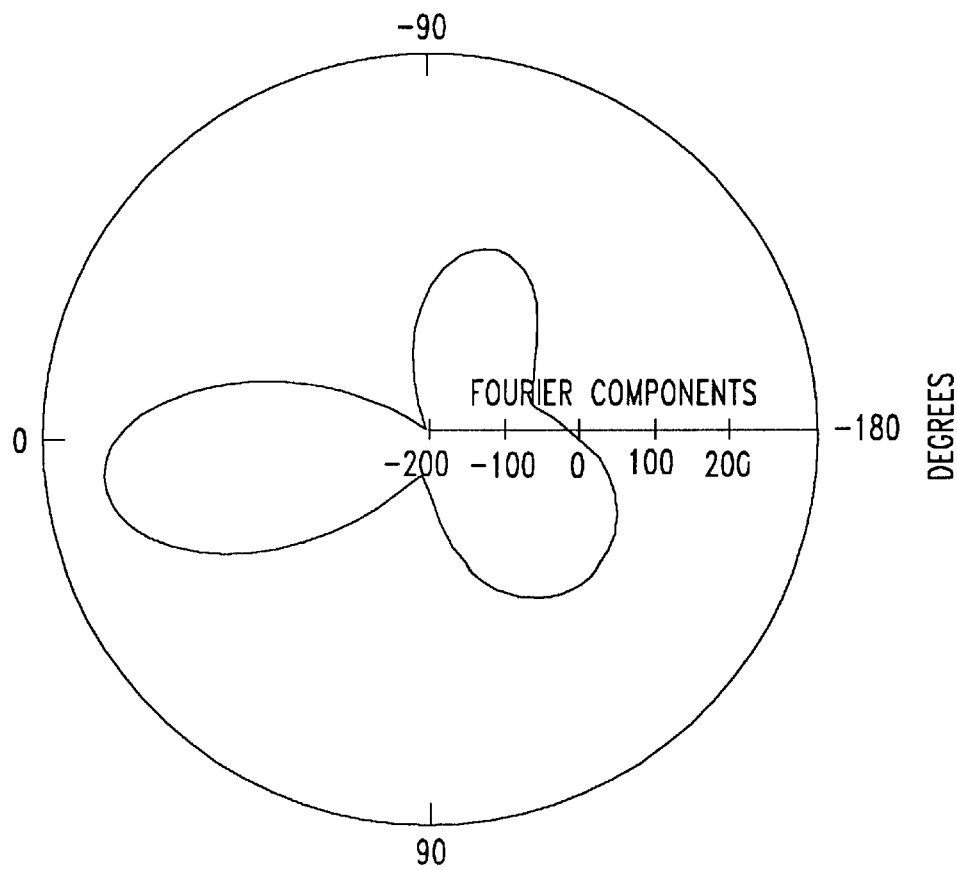
FIG. 7 shows a polar coordinate plot of Fourier transformed OES spectrum data signals at a single sampling time.

However, in accordance with another aspect of the present invention, it proves advantageous to plot information of the type shown in FIG. 4 on polar coordinates to yield a plot of the form of FIG. 6. As for FIG. 4, the plot of FIG. 6 includes plots of data in accordance with Eq. 1 for the entire dataset, i.e., $[I_1, \ldots, I_m]$ for all sample times, t. The plot of data in accordance with (Eq. 1) for one instant in time is shown in FIG. 7.

Figure 8:
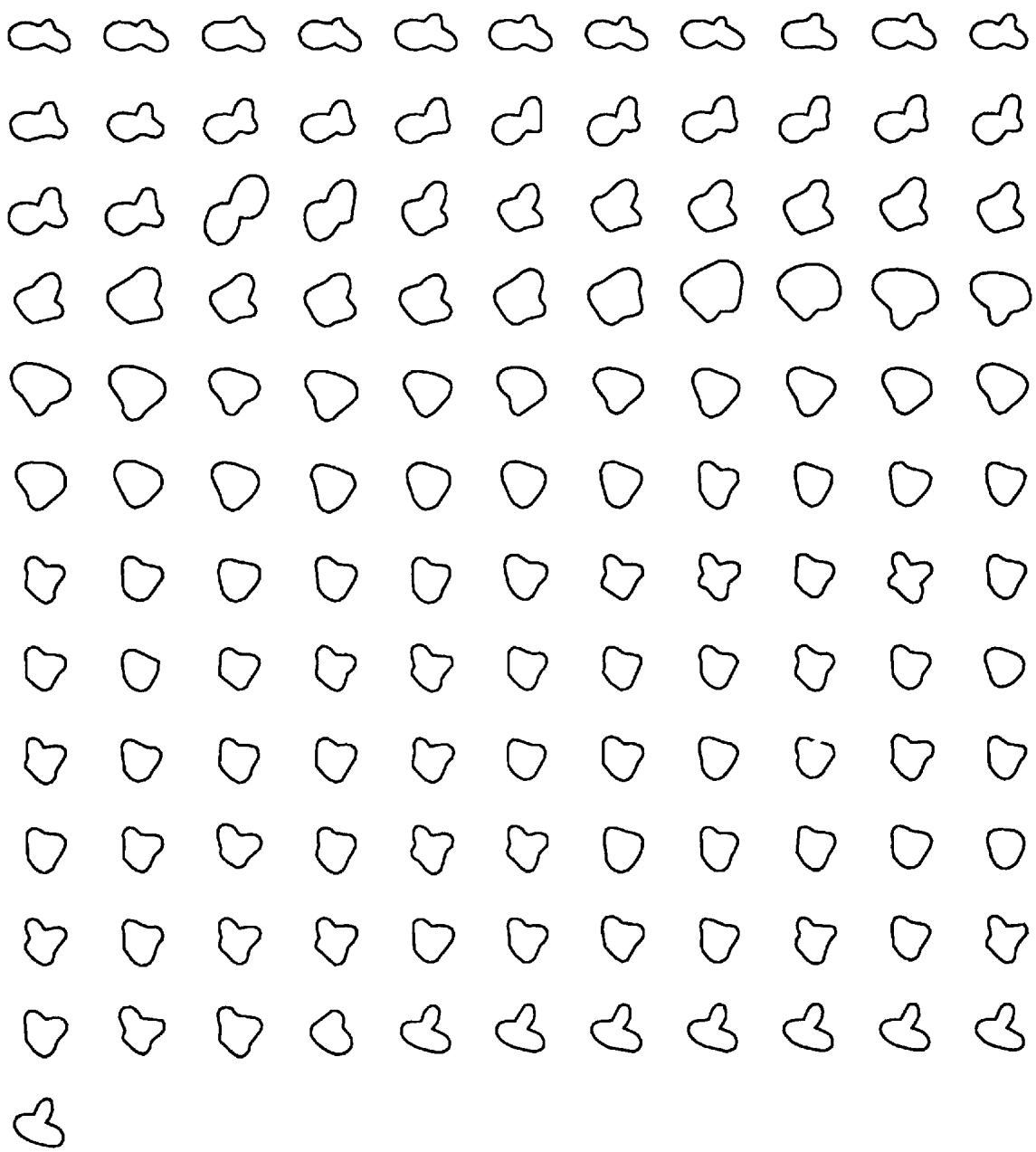
FIG. 8 Shows a sequence of Fourier blobs corresponding to illustrative OES spectrum data signals.

The importance of the above-described data transformation and display of the transformed data in polar coordinates becomes clear upon a consideration of FIG. 8. FIG. 8 shows a time sequence (with time increasing from left to right on a line, and from top to bottom for lines) of plots of the form of FIG. 7. Each blob in the display of FIG. 8 represents the state of the monitored process at a discrete time t. The overall set of blobs depicts the dynamic flow of monitored variables as the etching process continues.

Note should be made of the transition from blob shapes at the top of the plot of FIG. 8 to those at the bottom of that figure. On the last full row of FIG. 8, between about blob 3 and blob 5, changes occur in the blob shape that have been identified with the approach to the polysilicon etching endpoint. Blobs following this transition reflect overetch processing. It will be clear to those skilled in the art that particular other blob shape transitions can be identified with corresponding changes in the plasma etch environment.

Those skilled in the art will note that the early coefficients in Eq (1) will have a larger influence on blob shape, than those later in the equation. Nevertheless, even without knowledge of which wavelength or process signature is more important, it has been found that one may choose an arbitrary order in assigning process variables to the transformation and plotting described above. For the example yielding the blob matrix plot illustrated in FIG. 8, where m=8, the wavelengths were assigned to the coefficients $[I_1, \ldots, I_m]$ in the order: 251, 288, 309, 337, 725, 656, 447, 777 nm.

Figure 10:
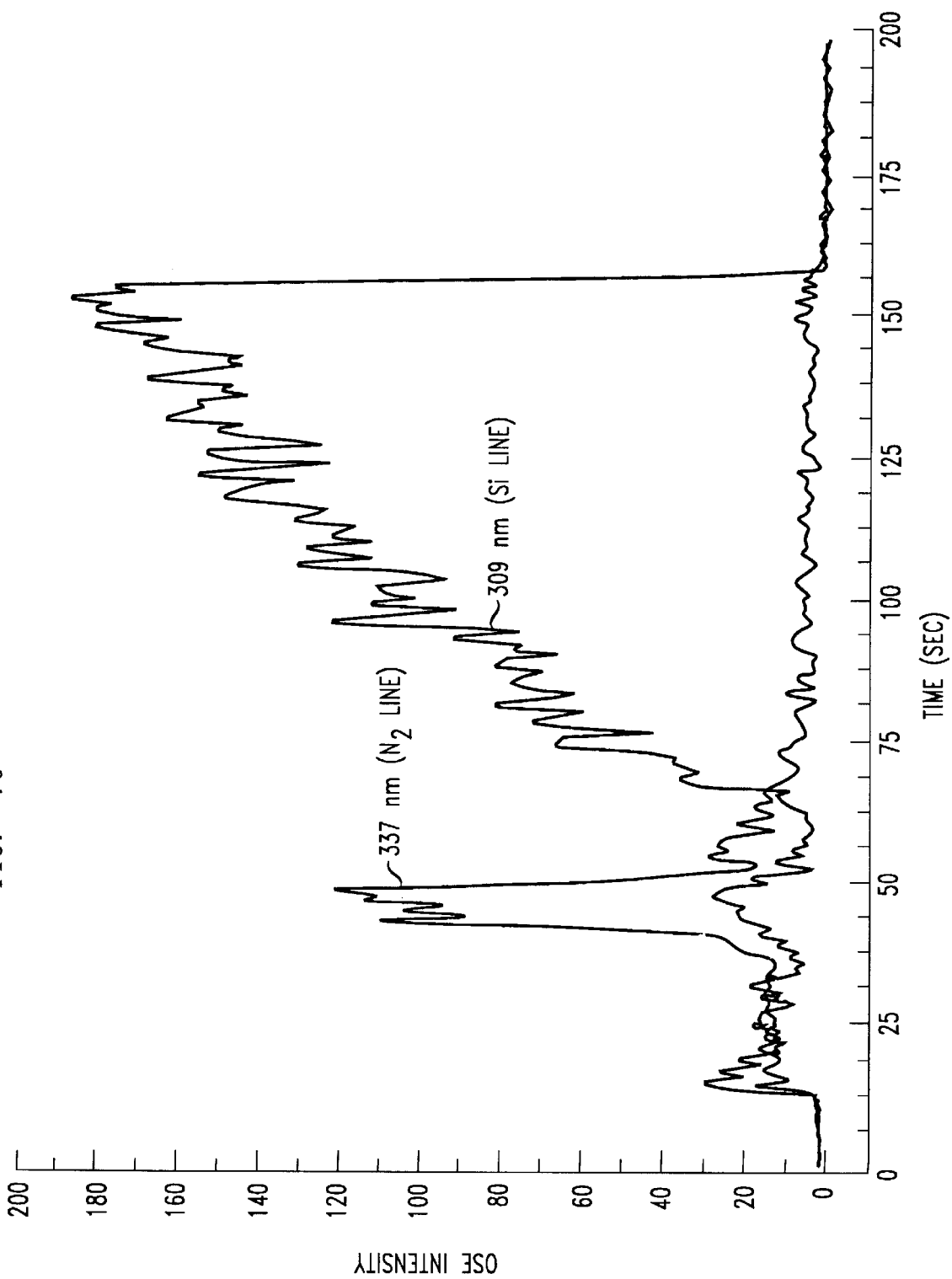
FIG. 10 is an OES plot for an observation of input data signals from two sensors.
Figure 11:
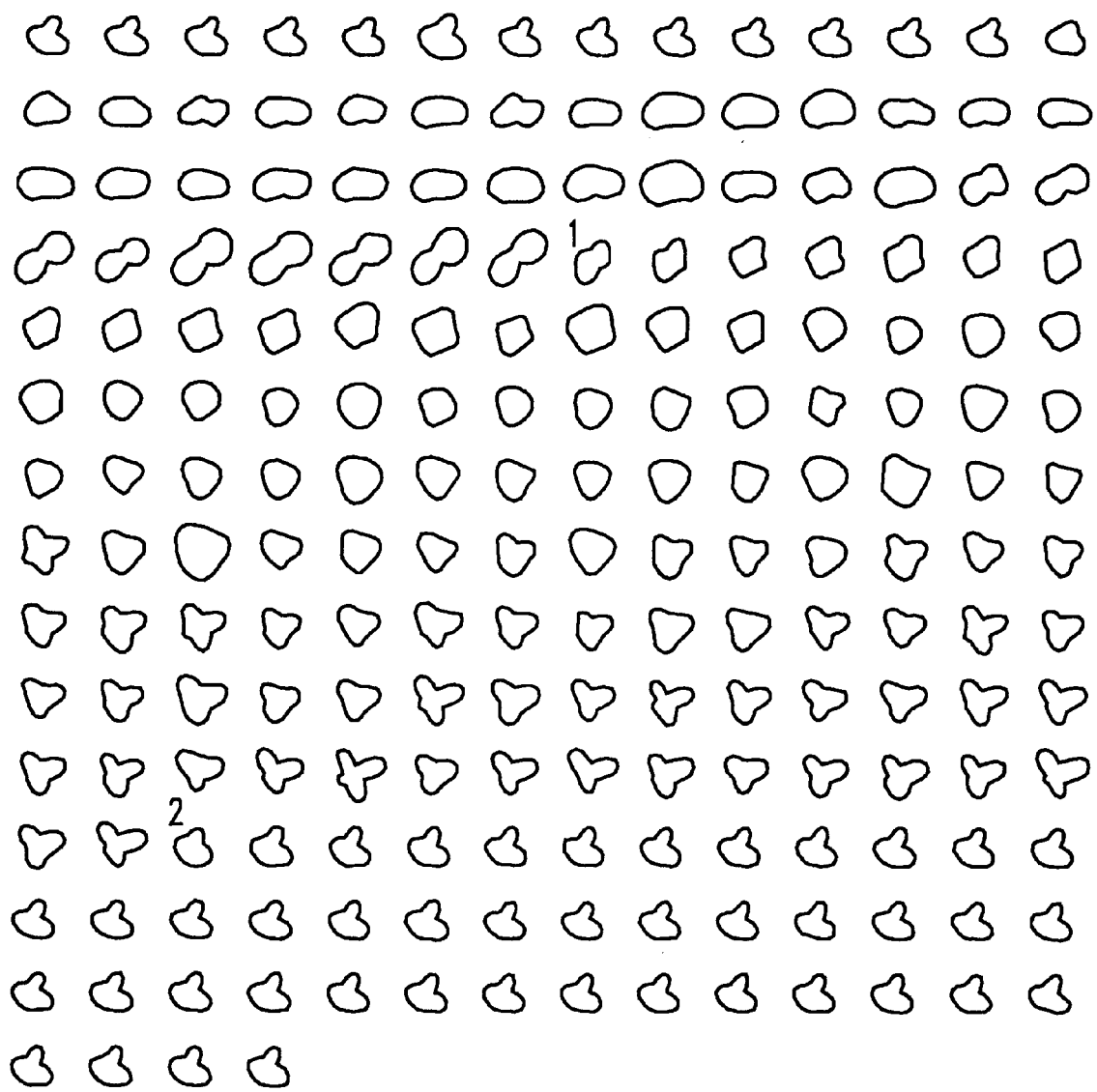
FIG. 11 shows a sequence of blobs corresponding to the OES data of FIG. 10.

In another illustrative embodiment of the present invention, semiconductor wafers including 1000 Å of titanium nitride (TiN) over 1800 Å of amorphous silicon (α-Si) on 70 Å of oxide, were patterned with 1500 Å thick oxide mask for defining a gate. Etching was performed in a low pressure high-density helicon plasma reactor. The chemistries used for the etching were a mixture of HBr and $Cl_2$ for the TiN layer, and HBr with $O_2$ for the α-Si layer. Optical emission spectroscopy traces, shown in FIG. 10, at 337 nm for $N_2$ and 309 nm for Si, show the TiN breakthrough with an increase in the $N_2$ emission and the α-Si breakthrough with an increase in the Si emission. The endpoints shown by the Fourier blobs, in FIG. 11, are consistent with those determined by OES, shown in FIG. 10. In FIG. 11 the endpoint for the TiN etch is at 52 seconds (labeled 1) and the endpoint for α-Si etch is at 155 seconds (indicated by 2 in FIG. 11).

FIG. 11 also shows the plasma stabilization and breakthrough on titanium nitride/oxide surface layers. The first row of blobs represents etching of this native oxide. Then the plasma begins to stabilize while the TiN layer is being etched. The blobs show several seconds in advance that the endpoint of the TiN layer is approaching at position 1. This is followed by the blobs beginning to stabilize to another shape while the α-Si is being etched. As noted, the α-Si endpoint is indicated at position (2) of FIG. 11 and shows several seconds in advance that the endpoint is approaching. These "early indicator blobs" are due to changes in the intensity of the OES signals and therefore, indicate changes in the molecular concentrations of species in the plasma. These subtle changes in the blobs are caused by nonuniformity in the etching across the wafer.

In another etch example a gate stack comprises 600Å of an antireflection coating (ARC) on 1650Å oxide hard mask and 800Å of $WSi_x$ on 1000 Å undoped α-Si over 60Å gate oxide. Etching was performed on the Lam TCP 9400. The process includes several discrete processing steps. The first step is a breakthrough step with the conditions: 250W TCP, 200W stage, and $Cl_2$ etching gas for 5 seconds. The second step is the $WSi_x$ etch step with the following conditions: 250W TCP, 200W stage and a mixture of $Cl_2$ and $He-O_2$. The endpoint occurred at 17 s (+30% overetch). The third etch step is designed to etch the α-Si and is the main etch process consisting of: 250 W TCP, 180 W stage with the etching gases HBr and $Cl_2$. The fourth and final step is the overetch step designed to improve uniformity of the gate oxide. It consists of: 300W TCP, 200W stage with HBr as the reactant gas which was mixed with $He-O_2$. The total etch time of that step in the particular example shown was 18s. The OES trace was recorded at 408 nm during etching and shows clear $WSi_x$ and α-Si endpoint in the plot of FIG. 12.

Figure 12:
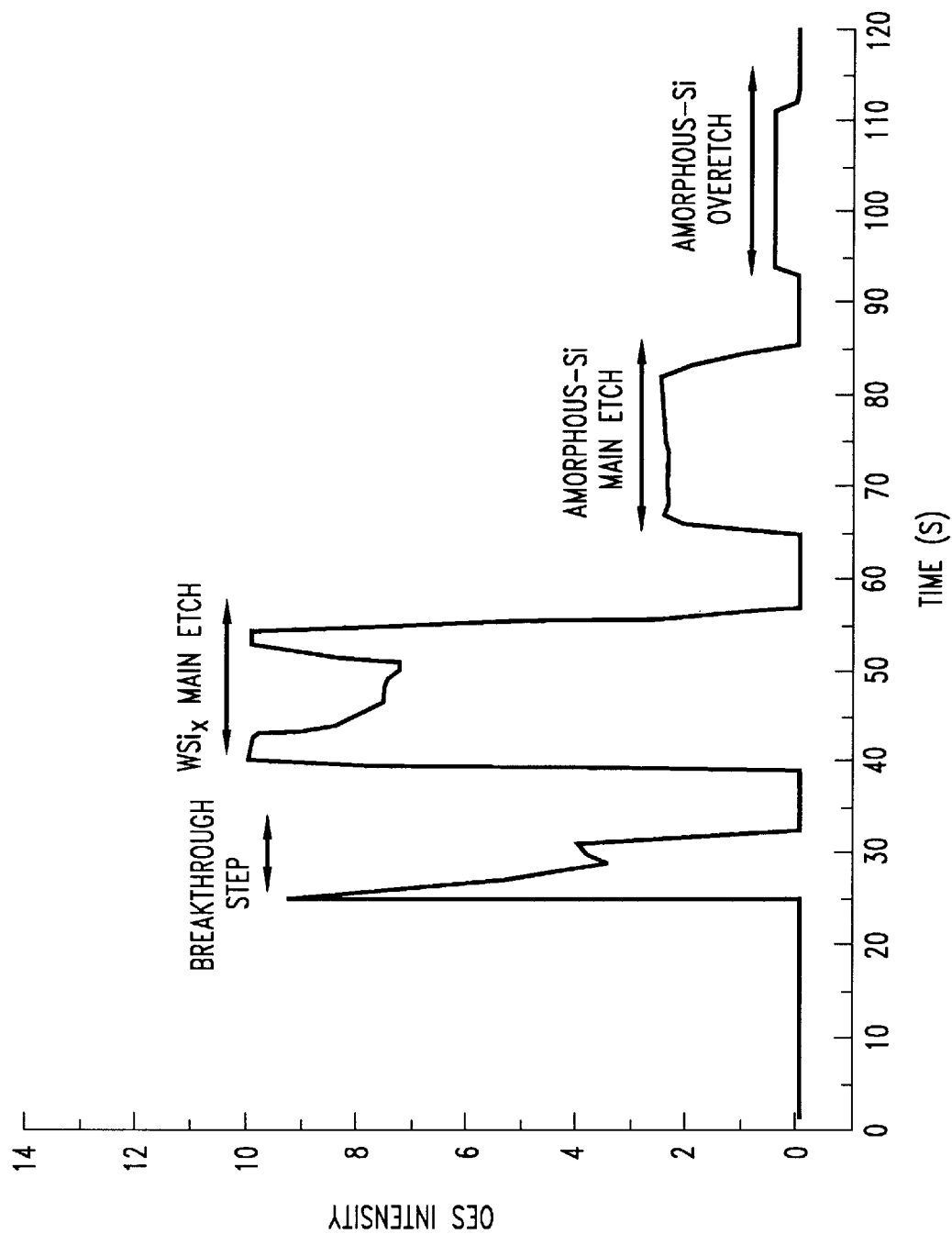
FIG. 12 is an OES plot for another etching process.
Figure 13:
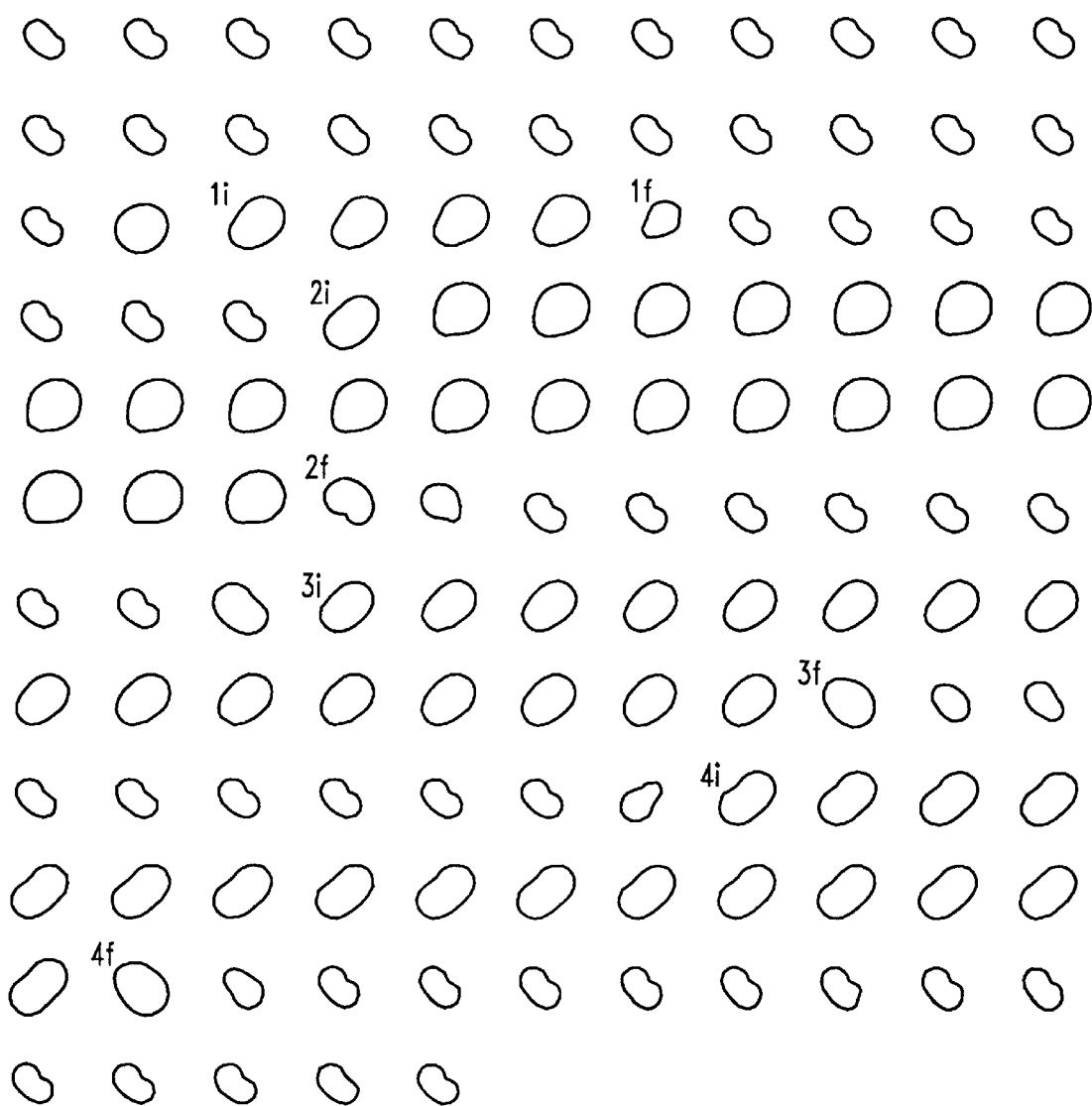
FIG. 13 shows a sequence of blobs corresponding to the OES data of FIG. 12 and other process variables.

The plot of Fourier blobs corresponding to the OES plot of FIG. 12 is shown in FIG. 13. The endpoints indicated by Fourier blobs are consistent with OES results. Here, the Fourier blobs were made from two lines of optical emission, applied TCP power and applied stage power, all of which were recorded during the etching of the wafer. In FIG. 13 the initiation (i) and completion (f) of each processing step is indicated. FIG. 13 shows a distinct change in the blob shapes at the endpoint of each of the processing steps. The first two rows of blobs show the gas stabilization. Blobs occurring between 1i and 1f indicate the first step or the breakthrough step. Blobs occurring between 1f and 2i indicate gas stabilization prior to starting step 2, the $WSi_x$ etch. Step 2 ends at 2f, and a gas stabilization for step 3 begins. Step 3, the Si etch, occurs between 3i and 3f. Then, following gas stabilization for step 4, the overetch, the process begins at 4i and ends at 4f. The last fourteen blobs can be explained as data collected from the process signatures and show that the values of these variables were constant when the RF was turned off.

Figure 14:
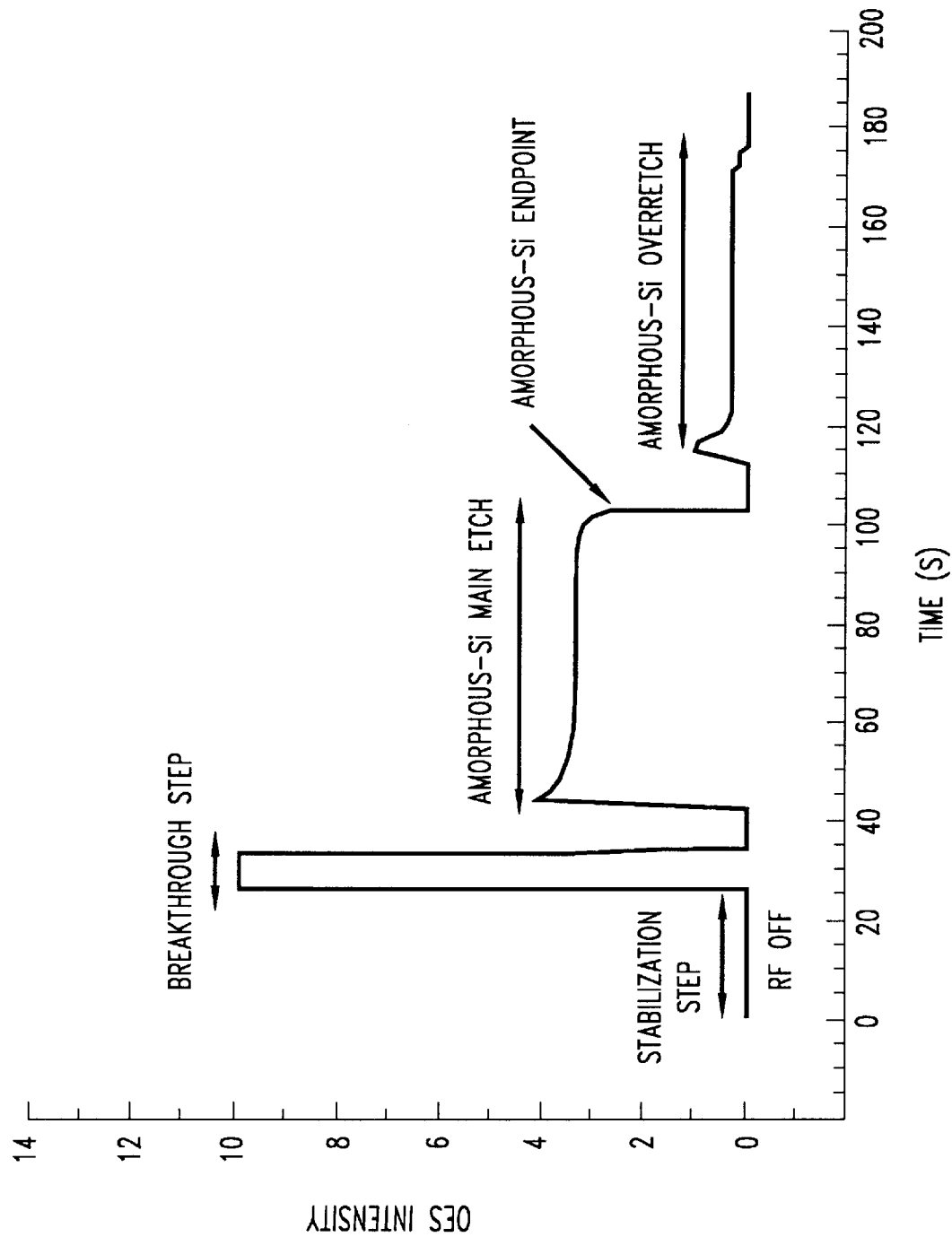
FIG. 14 is an OES plot for another etching process.
Figure 15:
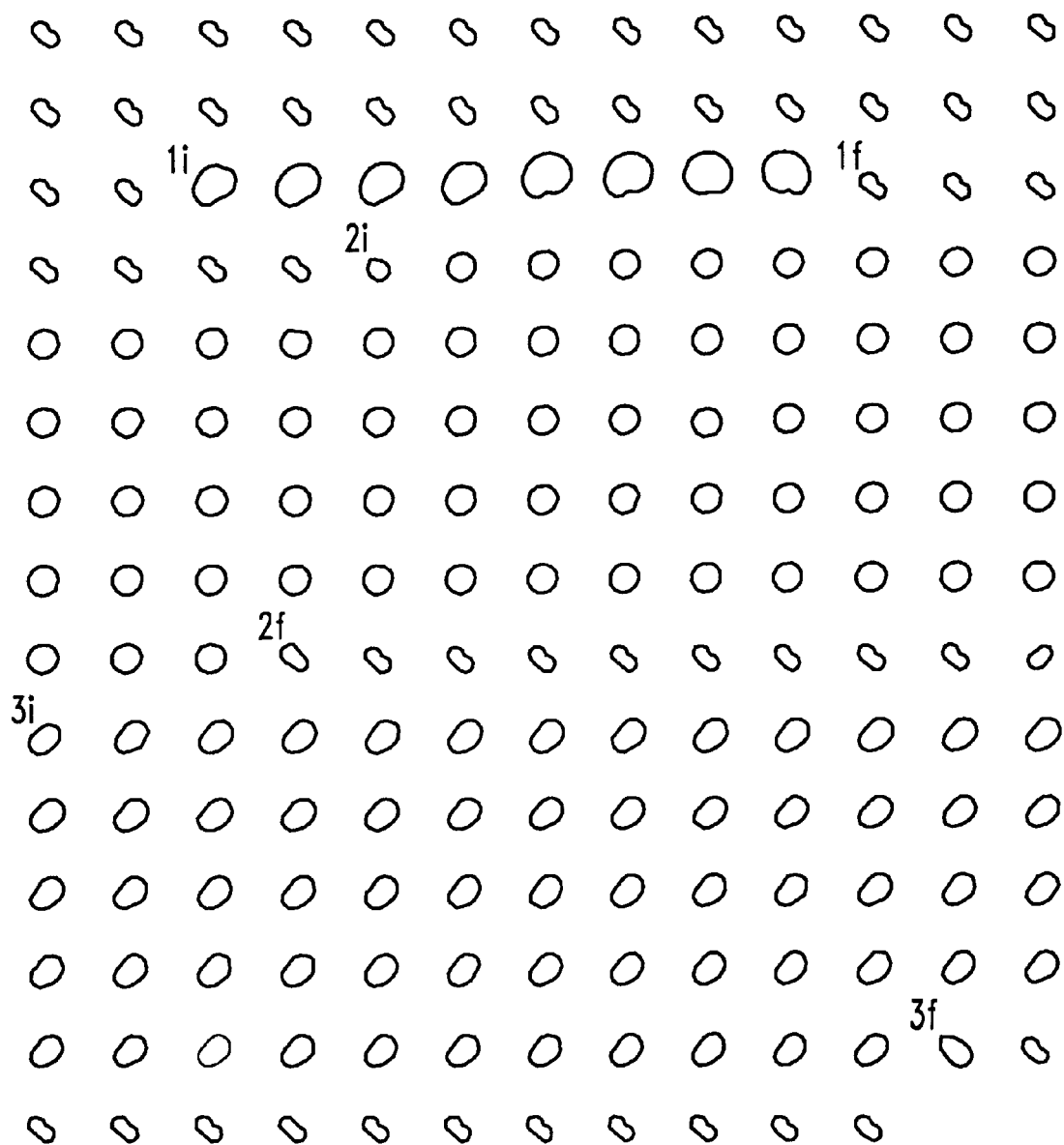
FIG. 15 shows a sequence of blobs corresponding to the OES data of FIG. 14 and other process variables.

FIGS. 14 and 15 show plots from another example of process monitoring and visualization in accordance with an embodiment of the present invention. This gate etch example consists of 3000 Å of doped α-Si, on 65 Å gate oxide. Etching is performed on a Lam TCP 9400. The etching is again a multistep process with the first step defined as the breakthrough step with 250W TCP, 200W stage and the reactant gas $Cl_2$ for 7 s. The main etch step consists of: 150 W TCP, 150 W stage and the reactant gases HBr and $Cl_2$ diluted with $He-O_2$ The third step, the overetch, is done under the following conditions: 250W TCP, 120W stage and a gas mixture of HBr and $He-O_2$. Endpoint is called at 62 s. The OES trace shown in FIG. 14 shows clear α-Si endpoint. The corresponding Fourier blobs plotted in FIG. 15 are derived from two lines of OES, TCP power and applied stage power, which were recorded as state signatures during the etch process. The stabilization time and the initial (i) and endpoint (f) of each processing step are shown in FIG. 15.

Figure 9:
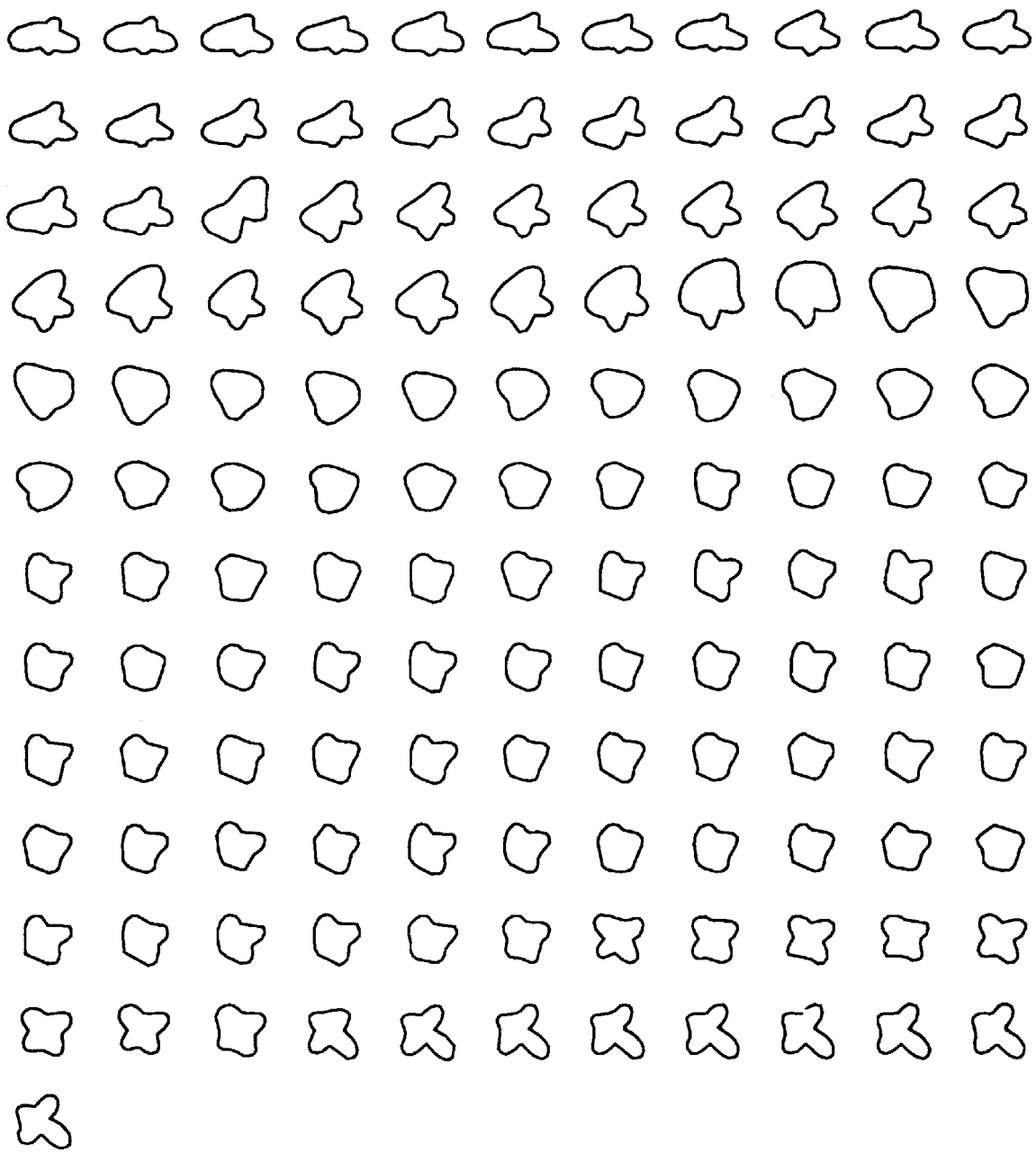
FIG. 9 Shows a sequence of blobs corresponding to illustrative TUB etch process data signals.

While the foregoing discussion of process monitoring and control has proceeded on the basis of input data derived at least in part from optical sensing of particular OES wavelengths present in the plasma environment, it should be recognized that these are by no means the only types of data inputs. In fact, it is not necessary to use any OES input signals. For example, the Fourier blobs shown in FIG. 9 are for a TUB etch process where the process parameters monitored were the flow rate of four gases, applied and reflected power, pressure and d-c bias. Other process variables, and other combinations of such variables will be used by those skilled in the art in employing the present invention in plasma etching and other processes.

The orthogonal transformation defined by (Eq. 1) proves useful in many situations, but other particular orthogonal transformations may be used in appropriate cases. Thus, for example, other well-known orthogonal transformations, including those employing wavelets, described, for example, in *Wavelets and Other Orthogonal Systems With Applications,* CRC Press, Fla., 1994 will prove advantageous in particular cases.

The illustrative blobs shown in the drawing are all two-dimensional, being a polar coordinate plot of (Eq. 1) for a discrete sequence of times. As for data visualizations generally, it proves convenient in some applications of the present invention to produce three-dimensional views. Recognizing that the Fourier blobs described above and shown in the drawing can be represented parametrically as $x = f(\theta)\cos(\theta)$ $y = f(\theta)\sin(\theta)$.

Here, f(θ) is given by (Eq.1). A useful three-dimensional representation can then be derived by defining z=sin(θ).

These last three relationships for x,y and z can then be applied to the transformed input signals to produce three-dimensional output signals for display and observation.

Mathematical and display operations for two-dimensional and three-dimensional plots of the types discribed above can advantageously be accomplished using conventional computer programming languages and environments. One example of a numeric programming language and environment is Mathematica from Wolfram Research. An illustrative Mathematica program listing useful in the generation of the three-dimensional plots described above is:

Parametric 3D Plot $x = f(t)\cos(t)$ $y = f(t)\sin(t)$ $z = \sin(t)$ $0 <= t <= 2Pi$ $-1 <= f(t) <= 1$ In[1]:=

ParametricPlot3D[

{ r Cos[t], r Sin[t],

Sin[t]

},

{t, 0, 2Pi}, {r, −1, 1},

Plotpoints -> {70, 10},

Boxed -> True,

Axes -.> True]

Out[1]=

-Graphics3D-.

The above-described system and methods for monitoring and controlling a plasma etching manufacturing process is merely illustrative of the application of the present invention. It will be recognized by those skilled in the art that the present invention is not limited to any particular set of manufacturing process variables as input data. Likewise, the source of the input datasets need not be a manufacturing process employing plasma etching, or a manufacturing process at all.

Other visualization methods and associated system for practicing such methods, all within the scope of the present invention, will occur to those skilled in the art. While the particular sequence of transitions for a set of Fourier blobs (or blobs based on any other orthogonal transformation) when applied to a particular manufacturing or other context will generally be different, and not always known a priori, trial observation and correspondence with the monitored data will quickly establish meaningful blob transitions that can be used by operators in a straightforward manner to perform any required control operations. Blobs of different particular shapes will be encountered in differing applications, but meaningful transitions will be recognized by those skilled in the art. Likewise, a complete matrix or other display of a start-to-finish blob sequence may not be necessary or desirable in some cases. Thus, in some cases, one or more particular subsets of blobs may prove useful for display. These subsets may be selected based on time or some other characteristic of the input data. In other cases only a most recent subset of blobs may be retained on the display device 34.

While use of some illustrative embodiments of the present invention contemplate human operator observation of a blob sequence to determine or anticipate any needed or desired changes or other action related to the process or entity under observation, it will be clear to those skilled in the art that, in appropriate cases, machine pattern matching and control may be used in place of human observation and intervention. Thus, when such a pattern matching system detects a particular blob shape, or a class of predefined shapes, occurring in the blob sequence, such pattern matching system generates appropriate control signals to effect a desired result. For example, a pattern matching system will recognize the emergence of one or more blobs of a type identified with an endpoint in a plasma etching process and generate control signals to modify operation of the etching process, e.g., by varying gas flow, bias level, or other system parameters.

While the illustrative examples presented above in terms of monitoring and real-time control of a process, the inventive teachings are not so limited. Thus data collected from diverse subject areas can be used as input for transformation and display as blobs in accordance with the present teachings. In such cases, data input may be stored in tables or databases in a system such as computer 24 in FIG. 1 or an external database, and processed in other than real time. Such processing may therefore be used, for example, in decision support systems other than process control.

Though the illustrative examples given above relate primarily to monitoring and control of manufacturing processes that proceed over a period of time, the present invention applies to applications other than those having time as the indepent variable. Thus, for example, blobs may be formed and displayed in a sequence reflecting spatial position or orientation, or other characteristic of the input data. In transforming input data in these cases, substitution of the appropriate variable for the time variable will be accomplished by practitioners in the art.

What is claimed is:

1. A method for processing a sequence of sets of input data signals, each set of input data signals comprising m $\leq 2$ data signals, the method comprising transforming each set of input data signals to a set of output data signals based on a transform function, thereby generating a sequence of sets of output signals, representing each set of output data signals in polar coordinate form, thereby forming a blob signal for each set of output data signals, and displaying said sequence of output data signals as a sequence of blobs.

2. The method of claim 1, wherein each said set of input data signals comprises data signals $I_1, I_2, \ldots I_m$, said transform function is based on a plurality of orthogonal functions.

3. The method of claim 2, wherein said orthogonal transform function is a Fourier transform function, and said sequence of blobs is a sequence of Fourier blobs.

4. The method of claim 2, wherein each of said sets of input data signals reflects the state of an observed process.

5. The method of claim 4, wherein said data signals $I_1, I_2, \ldots I_m$ reflect real time observations of respective state variables of said observed process.

6. The method of claim 5, wherein said observed process is a manufacturing process.

7. The method of claim 4, wherein each of said sets of input data signals reflects non-real time observations of said process.

8. The method of claim 6, wherein said manufacturing process is a plasma etching process and said state variables represent intensity values at optical emission spectrum wavelengths monitored in said plasma etching process.

9. The method of claim 8, wherein said transform function is given by $$f(\theta,t) = t_1/\sqrt{2} + I_2 \sin\theta + I_3 \cos\theta + \ldots + I_{m-1} \cos(m-1)\theta + I_m \sin m\theta.$$

10. The method of claim 9, wherein said input data sequence is processed until displayed Fourier blobs evidence changes characteristic of a predetermined change in said manufacturing process.

11. The method of claim 6, wherein said manufacturing process is a TUB etch process and said variables a represent a plurality of etch process parameters selected from: flow rate of etch process gases, applied and reflected power, pressure and d-c bias.

12. A system for processing a sequence of m-dimensional input data signals, m $\leq 2$, the method comprising a data processor for transforming each m-dimensional input data signal to an output transformed signal based on a transform function, and for converting each said transformed signal to polar coordinate form to form respective blob signals, and a display system for displaying said blob signals.

13. The system of claim 12, wherein said multi-dimensional input data signals each represent the state of a monitored process at a particular time, and said sequence of blobs represents a data visualization of the state of said monitored process at discrete times.

14. The system of claim 13, wherein said process is a manufacturing process.

15. The system of claim 14, wherein said m-dimensional input data signals represent manufacturing process variables, at least some of which vary as a function of time.

16. The system of claim 15, wherein said manufacturing process is a plasma etching process, and wherein said process variables include a plurality of variables selected from: one or more optical emission spectra intensities, gas pressures, gas flow, and bias on etching electrodes.

* * * * *